US011552552B2

(12) United States Patent
Rowley (10) Patent No.: US 11,552,552 B2
(45) Date of Patent: *Jan. 10, 2023

(54) POWER MANAGEMENT INTEGRATED CIRCUIT WITH BLEED CIRCUIT CONTROL (71) Applicant: Micron Technology, Inc., Boise, ID (US)

(72) Inventor: Matthew David Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 354 days.

This patent is subject to a terminal disclaimer.

(21) Appl. No.: 15/918,960

(22) Filed: Mar. 12, 2018

(65) Prior Publication Data
US 2019/0280600 A1 Sep. 12, 2019

(51) Int. Cl.
H02M 1/32 (2007.01)
H02M 3/335 (2006.01)
G06F 1/30 (2006.01)
H01L 23/50 (2006.01)
G11C 5/14 (2006.01)
H01L 23/498 (2006.01)

(52) U.S. Cl.
CPC .............. H02M 1/32 (2013.01); *G06F 1/305* (2013.01); *G11C 5/14* (2013.01); *H01L 23/49838* (2013.01); *H01L 23/50* (2013.01); *H02M 1/322* (2021.05); *H02M 3/33507* (2013.01)

(58) Field of Classification Search
CPC .... H02M 3/33507; H02M 1/32; H02M 1/322; G06F 1/305; H01L 23/49838; H01L 23/50
See application file for complete search history.

(56) References Cited

U.S. PATENT DOCUMENTS

| 11,223,282 | B2* | 1/2022 | Rowley | G11C 7/20 |
| 2013/0343090 | A1* | 12/2013 | Eom | H02M 3/33507 363/16 |
| 2015/0145441 | A1* | 5/2015 | Brandt | H05B 37/02 315/307 |
| 2017/0149325 | A1* | 5/2017 | Lau | H02M 1/32 |
| 2017/0273150 | A1* | 9/2017 | Swaminathan | H05B 33/0809 |
| 2018/0018119 | A1* | 1/2018 | Chin | G06F 3/0625 |
| 2019/0124736 | A1* | 4/2019 | Zhu | H05B 45/3575 |
| 2019/0179685 | A1* | 6/2019 | Ki | G06F 3/0688 |

OTHER PUBLICATIONS

David Paterson, "Flash Core Voltage Supply: Requirements and Considerations", Jun. 2013.

* cited by examiner

Primary Examiner — Jue Zhang
(74) Attorney, Agent, or Firm — Greenberg Traurig (57) ABSTRACT A memory system having a non-volatile memory and a power management integrated circuit (PMIC) that has a voltage regulator to apply a voltage on the non-volatile memory during normal operations. During a shutdown process, the PMIC has a bleeder that is activated to reduce the voltage applied on the non-volatile memory to a level that is below a programmable threshold, before allowing the memory system to restart again. During the bleeding operation, a comparator of the PMIC compares the voltage applied to the non-volatile memory and the threshold to determine whether the shutdown process can be terminated for a restart.

10 Claims, 4 Drawing Sheets

POWER MANAGEMENT INTEGRATED CIRCUIT WITH BLEED CIRCUIT CONTROL

FIELD OF THE TECHNOLOGY

At least some embodiments disclosed herein relate to power management integrated circuit (PMIC) in general and, more particularly but not limited to, a PMIC with bleed circuit control.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A memory system may use a Power Management Integrated Circuit (PMIC) to manage the power requirements of the system or subsystem. The PMIC typically includes electronic power conversion circuitry and/or relevant power control functions.

BRIEF DESCRIPTION OF THE DRAWINGS

The embodiments are illustrated by way of example and not limitation in the figures of the accompanying drawings in which like references indicate similar elements.

DETAILED DESCRIPTION

Aspects of the present disclosure are directed to a power management integrated circuit (PMIC) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include media. The media can be non-volatile memory devices, such as, for example, negative-and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

At least some embodiments disclosed herein provide a PMIC having a bleeder which, in response to a shutdown signal, brings the voltage applied to a non-volatile memory down to a level that is below a programmable threshold, before allowing the voltage of the non-volatile memory to be powered up again to a level for normal operations.

A non-volatile memory, such as an NAND flash memory, has a core voltage that may be required to be bled down to a low level before restarting the memory (e.g., NAND die) back up. Instead of budgeting for a bleed to happen for a predetermined time to bring down the voltage, a PMIC according to at least one embodiment disclosed herein has a function that bleeds the NAND core voltage in a shutdown process and simultaneously monitors the NAND core voltage for comparison with a programmable threshold. The bleed continues, and restarting is prevented, until the threshold is satisfied. The comparator threshold is to be programmed for the desired trip level of the particular memory that is to be powered by the PMIC. Therefore, the voltage requirement of the memory can be met according to the design of the memory; and changes can be made, if needed, to suit different flash memory technologies. Additionally, the power up boot sequence can be initiated as soon as the threshold voltage level is reached, which optimizes the time duration between shutdown and restart and eliminates discrete board costs and design time/optimization. The programmable threshold completely eliminates the guess work in budgeting the time period for bleeding the memory core voltage to satisfy the voltage requirements of the memory that is to be powered by the PMIC.

Figure 1:
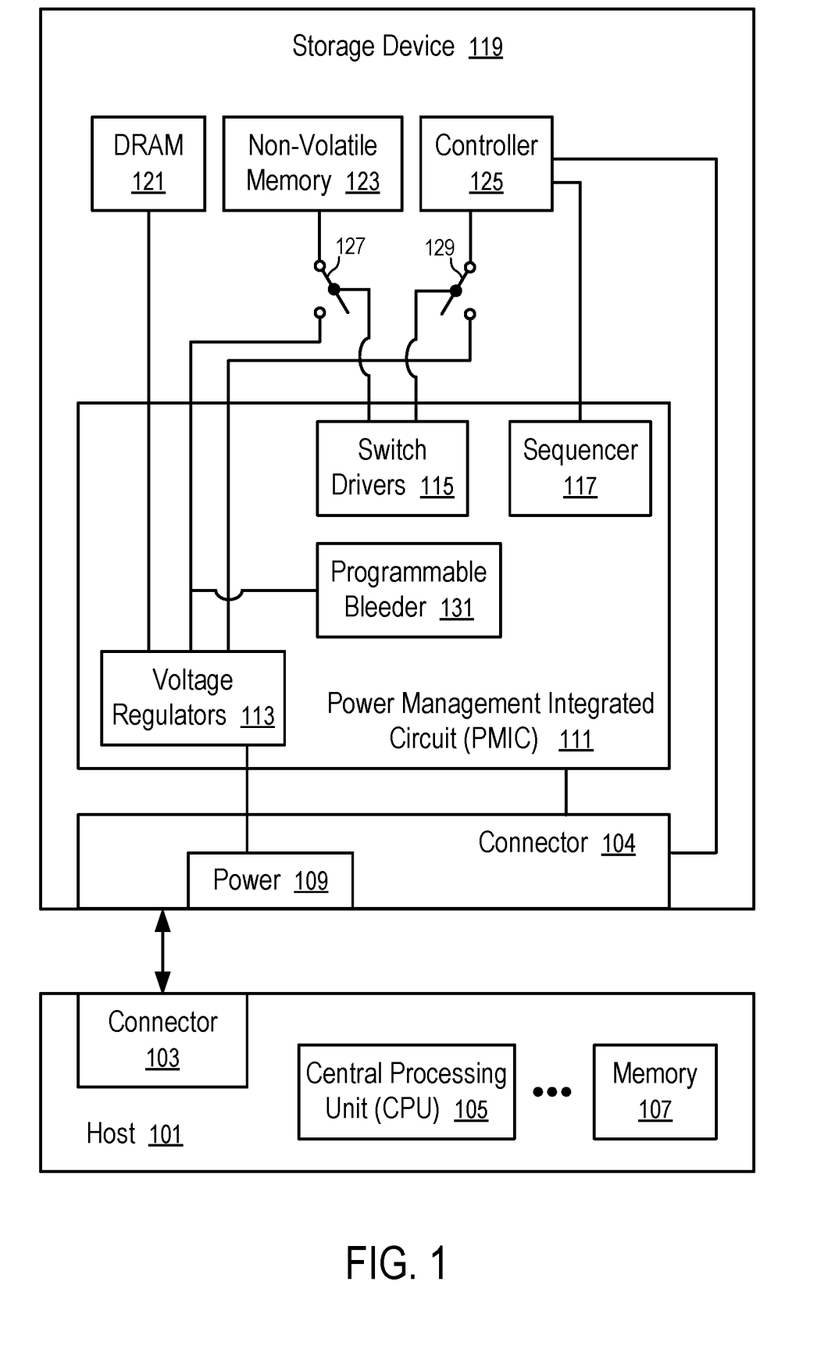
FIG. 1 shows a computer system having a power management integrated circuit (PMIC) configured to control a voltage provided to a non-volatile memory.

FIG. 1 shows a computer system having a power management integrated circuit (PMIC) configured to control a voltage provided to a non-volatile memory.

The computer system of FIG. 1 includes a host (101) connected to a storage device (119) that has a power management integrated circuit (PMIC) (111), a controller (125), a non-volatile memory (123), and an optional Dynamic Random-Access Memory (DRAM) (121).

The PMIC (111) has a programmable bleeder (131) that is activated during a shutdown process to bring the voltage connected to the non-volatile memory (123) to a level that is below a programmable threshold, before the PMIC (111) is allowed to power up again the non-volatile memory (123). The threshold may be programmed via the host (101), or via another device in a manufacturing facility of the storage device (119) (e.g., before the PMIC (111) is installed and/or used in the storage device (119)).

The host (101) can be a computer having one or more Central Processing Units (CPUs) (105) and a memory (107). Computer peripheral devices, such as the storage device (119), may be attached to the host (101) via an interconnect, such as a computer bus (e.g., Peripheral Component Interconnect (PCI), PCI eXtended (PCI-X), PCI Express (PCIe), Serial Advanced Technology Attachment (SATA)), a communication port, and/or a computer network.

The host (101) has one or more connectors (e.g., 103) to provide the storage device (119) with power (109) and/or communicate with the storage device (119) via a communication channel in accordance with a predetermined protocol; and the storage device (119) has one or more connectors (e.g., 104) to receive the power (109), data and commands from the host (101).

The PMIC (111) has one or more voltage regulators (113) that convert the power (109) to operating voltages used by various components of the storage device (119), such as the controller (125), the non-volatile memory (123), and the DRAM (121).

The storage device (119) may include a plurality of load switches (e.g., 127 and 129) for the isolation of power domains. During operational modes the load switches (127 and 129) are turned on to provide power (109) via the voltage regulators (113) to these corresponding components. During certain non-operational modes the load switches (127 and 129) can be turned off to isolate the power (109) from some of the components of the storage device (119), such as the controller (125), the non-volatile memory (123). To reduce the cost of the PMIC (111), the load switches (127 and 129) are implemented outside of the PMIC (111). The PMIC (115) includes a plurality of switch drivers (115) that provide the control signals for the load switches (127 and 129).

The PMIC (111) includes a sequencer (117) that schedules the power related events according to desirable sequences for the operations of the storage device (119), including the sequences of the operations of the voltage regulators (113) and the switch drivers (115). In some situations the sequencer (117) may communicate with the controller (125) to request the controller (125) to enter a sleep mode or a power off mode and then turn off certain voltages or power domains; and in other situations, the controller (125) may request the sequencer (117) to place the PMIC (111) in a sleep mode.

In general, some control signals, data and/or commands received from the host (101) are connected to the PMIC (111) for power managements. Other control signals, data and commands from the host (101) are routed to the controller (125) for processing.

The computer storage device (119) can be used to store data for the host (101). Examples of computer storage devices in general include hard disk drives (HDDs), solid state drives (SSDs), flash memory, dynamic random-access memory, magnetic tapes, network attached storage device, etc. The storage device (119) communications with the host (101) using the communication channel. For example, the communication channel between the host (101) and the storage device (119) is a PCIe bus in one embodiment; and the host (101) and the storage device (119) communicate with each other using NVMe protocol.

In some implementations, the communication channel between the host (101) and the storage device (119) includes a computer network, such as a local area network, a wireless local area network, a wireless personal area network, a cellular communications network, a broadband high-speed always-connected wireless communication connection (e.g., a current or future generation of mobile network link); and the host (101) and the storage device (119) can be configured to communicate with each other using data storage management and usage commands similar to those in NVMe protocol.

The controller (125) of the storage device (119) runs firmware to perform operations responsive to the communications from the host (101) and/or the PMIC (111). Firmware in general is a type of computer program that provides control, monitoring and data manipulation of engineered computing devices. The firmware of the storage device (119) controls the operations of the controller (125) in operating the storage device (119), such as storing and accessing data in non-volatile memory (123) of the storage device (119), performing power management tasks, etc.

Non-volatile storage media (123) in general may be implemented via various techniques, such as memory cells in an integrated circuit, magnetic material coated on rigid disks, etc. The storage media (123) is non-volatile in that no power is required to maintain the data/information stored in the non-volatile storage media (123), which data/information can be retrieved after the non-volatile storage media (123) is powered off and then powered on again. The memory cells may be implemented using various memory/storage technologies, such as NAND gate based flash memory, phase-change memory (PCM), magnetic memory (MRAM), resistive random-access memory, and 3D XPoint, such that the storage media (123) is non-volatile and can retain data stored therein without power for days, months, and/or years.

The storage device (119) may use volatile Dynamic Random-Access Memory (DRAM) (121) for the storage of run-time data and instructions used by the controller (125) to improve the computation performance of the controller (125) and/or provide buffers for data transferred between the host (101) and the non-volatile storage media (123). DRAM (121) is volatile in that it requires power to maintain the data/information stored therein, which data/information is lost immediately or rapidly when the power is interrupted.

Volatile DRAM (121) typically has less latency than non-volatile storage media (123), but loses its data quickly when power is removed. Thus, it is advantageous to use the volatile DRAM (121) to temporarily store instructions and data used for the controller (125) in its current computing task to improve performance. In some instances, the volatile DRAM (121) is replaced with volatile Static Random-Access Memory (SRAM) that uses less power than DRAM in some applications. When the non-volatile storage media (123) has data access performance (e.g., in latency, read/write speed) comparable to volatile DRAM (121), the volatile DRAM (121) can be eliminated; and the controller (125) can perform computing by operating on the non-volatile storage media (123) for instructions and data instead of operating on the volatile DRAM (121).

For example, cross point storage and memory devices (e.g., 3D XPoint memory) have data access performance comparable to volatile DRAM (121). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (125) has in-processor cache memory with data access performance that is better than the volatile DRAM (121) and/or the non-volatile storage media (123). Thus, it is preferred to cache parts of instructions and data used in the current computing task in the in-processor cache memory of the controller (125) during the computing operations of the controller (125). In some instances, the controller (125) has multiple processors, each having its own in-processor cache memory.

Optionally, the controller (125) performs data intensive, in-memory processing using data and/or instructions organized in the storage device (119). For example, in response to a request from the host (101), the controller (125) performs a real time analysis of a set of data stored in the storage device (119) and communicates a reduced data set to the host (101) as a response. For example, in some applications, the storage device (119) is connected to real time sensors to store sensor inputs; and the processors of the controller (125) are configured to perform machine learning and/or pattern recognition based on the sensor inputs to support an artificial intelligence (AI) system that is implemented at least in part via the storage device (119) and/or the host (101).

In some implementations, the processors of the controller (125) are integrated with memory (e.g., 121 or 123) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate, and decreases latency and power usage.

The storage device (119) can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

Some embodiments involving the operation of the controller (125) can be implemented using computer instructions executed by the controller (125), such as the firmware of the controller (125). In some instances, hardware circuits can be used to implement at least some of the functions of the firmware. The firmware can be initially stored in the non-volatile storage media (123), or another non-volatile device, and loaded into the volatile DRAM (121) and/or the in-processor cache memory for execution by the controller (125).

Figure 2:
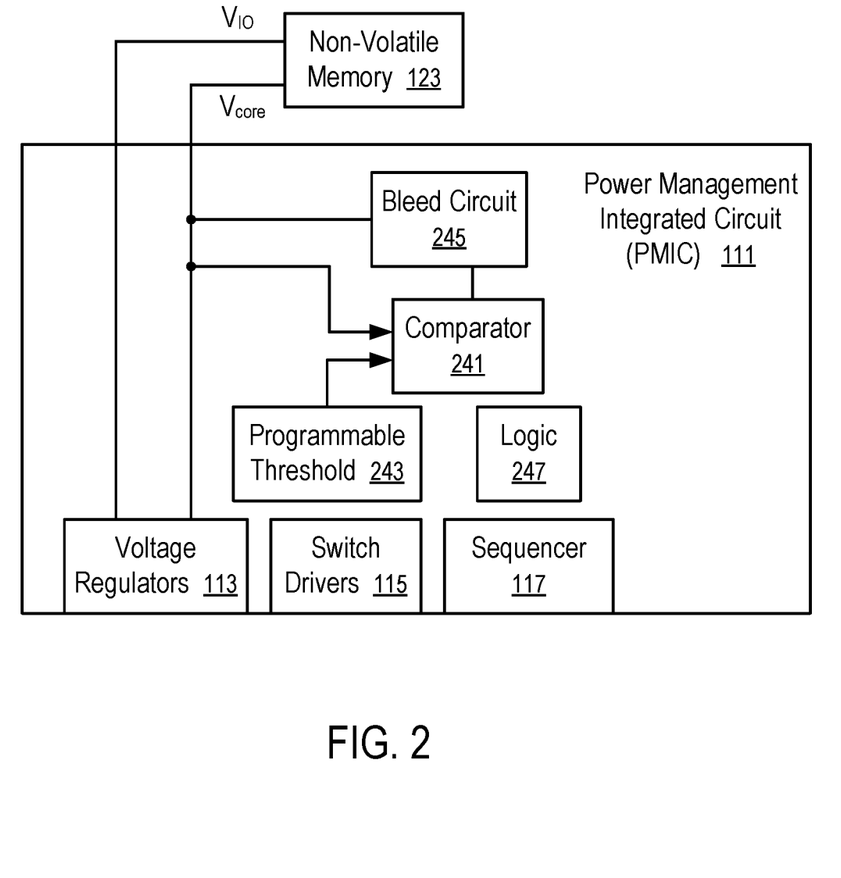
FIG. 2 shows a power management integrated circuit (PMIC) configured to control a voltage applied to a non-volatile memory.

FIG. 2 shows a power management integrated circuit (PMIC) configured to control a voltage applied to a non-volatile memory. For example, the PMIC (111) of FIG. 2 can be used in the system of FIG. 1

The PMIC (111) of FIG. 2 includes a comparator (245) that controls the operation of a bleed circuit (245) based on the core voltage ($V_{core}$) applied to the non-volatile memory (123) and the programmable threshold (243).

For example, the bleed circuit (245) may include a bleed resister connected to a switch that can be turned on to engage the bleed resister and activate the bleed circuit (245) in reducing the voltage ($V_{core}$) to which the bleed circuit (245) is connected. The switch can be turned off to disengage the bleed resister and deactivate the bleed circuit (245).

During the process to shut down or power down the non-volatile memory (123), such as the non-volatile memory (123) of the storage device (119) of FIG. 1 or another device, logic (247) of the sequencer (117) actives the bleed circuit (245) to reduce or bleed the core voltage ($V_{core}$).

Once the bleeding or reducing of the core voltage ($V_{core}$) starts, the output of the comparator (241) determines the time instance at which the bleeding operation can be terminated.

For example, when the core voltage ($V_{core}$) is higher than the threshold (243), the output of the comparator (241) keeps the bleed circuit (245) active and keeps the sequencer (117) from restarting to power up the non-volatile memory (123) using the voltage regulator(s) (113).

When the core voltage ($V_{core}$) is no longer higher than the threshold (243), the output of the comparator (241) may deactivate the bleed circuit (245) and/or allow the sequencer (117) to cause the voltage regulator(s) (113) to restart powering up the non-volatile memory (123).

The PMIC (111) illustrated in FIGS. 1 and 2 has an integrated bleed function for a non-volatile memory (123). The output of the comparator (241) causes the core voltage ($V_{core}$) to be bled/reduced at least to the particular threshold (243) that is required specifically for the non-volatile memory (123) powered by the PMIC (111), before the non-volatile memory (123) is restarted.

When the PMIC (111) is to be used with another non-volatile memory (123) that has a different bleeding requirement, the threshold (243) of the PMIC (111) can be programmed or reprogrammed according to the corresponding bleeding requirement.

For example, a manufacturing facility of the storage device (119) may program the threshold (243) according to the requirement of the non-volatile memory (123) that is to be powered by the PMIC (111), before assembling the non-volatile memory (123) and the PMIC (111) into the storage device (119).

For example, the threshold (243) of the PMIC (111) may be preprogrammed for safe operations of a set of known types of non-volatile memories (e.g., 123). After the PMIC (111) is installed in the storage device (119) with a particular non-volatile memory (123), the storage device (119) can be connected to a host (101) for customization where the threshold (243) is optimized for the operation of the particular non-volatile memory (123) used in the storage device (119). The optimization ensures that during a shutdown/powering down process, the core voltage ($V_{core}$) applied to the non-volatile memory (123) is bled at least to a preferred level while allowing the non-volatile memory (123) to be restarted, powered up again as soon as the preferred level is reached in bleeding.

The voltage regulators (113) also provide a voltage ($V_{IO}$) that is suitable for input and/or output operations of the non-volatile memory (123). For example, the controller (125) of the storage device (119) may selectively apply the voltage ($V_{IO}$) to retrieve/read data from the non-volatile memory (123) and/or to write/program data into the non-volatile memory (123).

In some instances, a voltage ($V_{IO}$) is also bled to a programmable threshold in a similar way, where the voltages ($V_{IO}$ and $V_{core}$) may have separate and different programmable thresholds (e.g., 243) for bleeding control.

Figure 3:
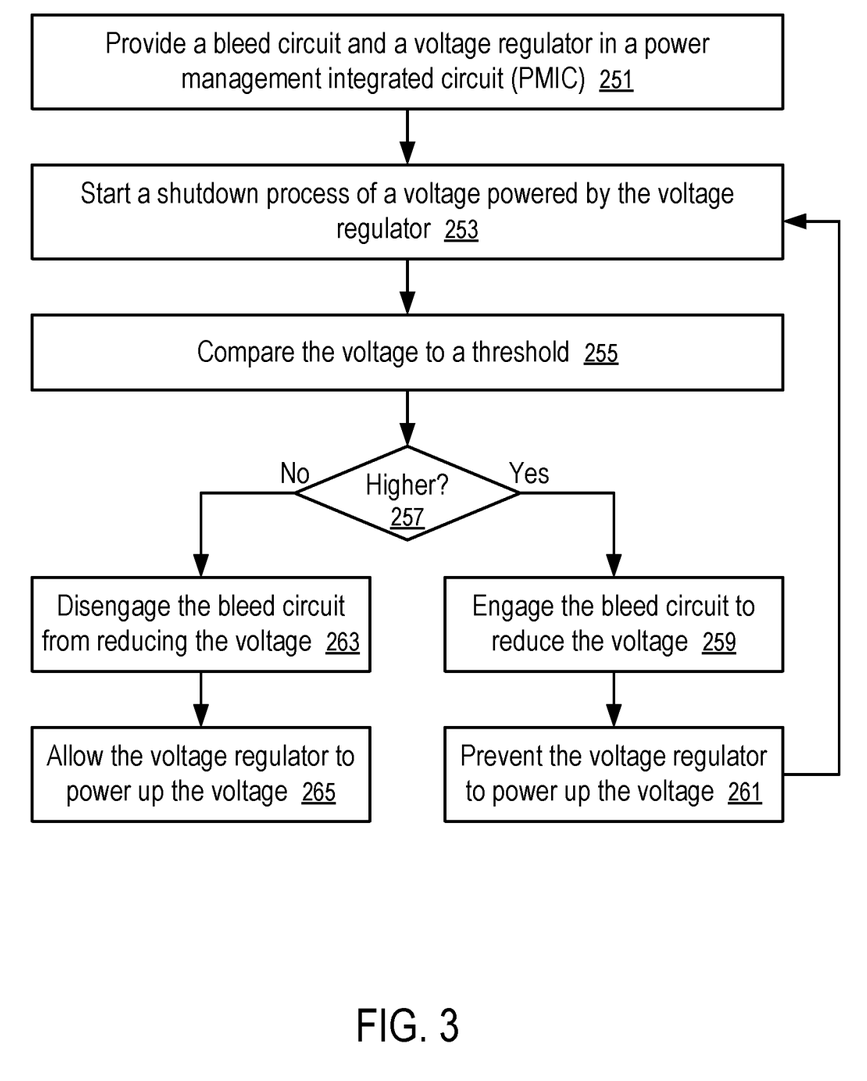
FIG. 3 shows a method to control a voltage applied to a non-volatile memory.

FIG. 3 shows a method to control a voltage applied to a non-volatile memory. For example, the method of FIG. 3 can be implemented in the PMIC (111) illustrated in FIGS. 1 and/or 2.

The method of FIG. 3 includes: providing (251) a bleed circuit (245) and a voltage regulator (113) in a power management integrated circuit (PMIC) (111); starting (253) a shutdown process of a voltage (e.g., $V_{core}$) powered by the voltage regulator (113); and comparing (255) the voltage ($V_{core}$) to a threshold (243).

If (257) the voltage ($V_{core}$) is higher than the threshold (243), the method of FIG. 3 further includes engaging (259) the bleed circuit (245) to reduce the voltage ($V_{core}$); and preventing (261) the voltage regulator (113) to power up the voltage ($V_{core}$). In some instances, the output of the comparator (241) prevents the sequencer (117) to start certain powering up sequences when the voltage ($V_{core}$) is higher than the threshold (243).

If (257) the voltage ($V_{core}$) is not higher than the threshold (243), the method of FIG. 3 further includes disengaging (263) the bleed circuit (245) from reducing the voltage ($V_{core}$) (in some instances, in response to a restart process); and allowing (265) the voltage regulator (113) to power up the voltage ($V_{core}$) (e.g., to allow the restart as soon as permitted by the bleeding requirement). In some instances, when the voltage ($V_{core}$) is not higher than the threshold (243), the output of the comparator (241) allows the sequencer (117) to start certain powering up sequences that are prevented from started while the voltage ($V_{core}$) is higher than the threshold (243).

Figure 4:
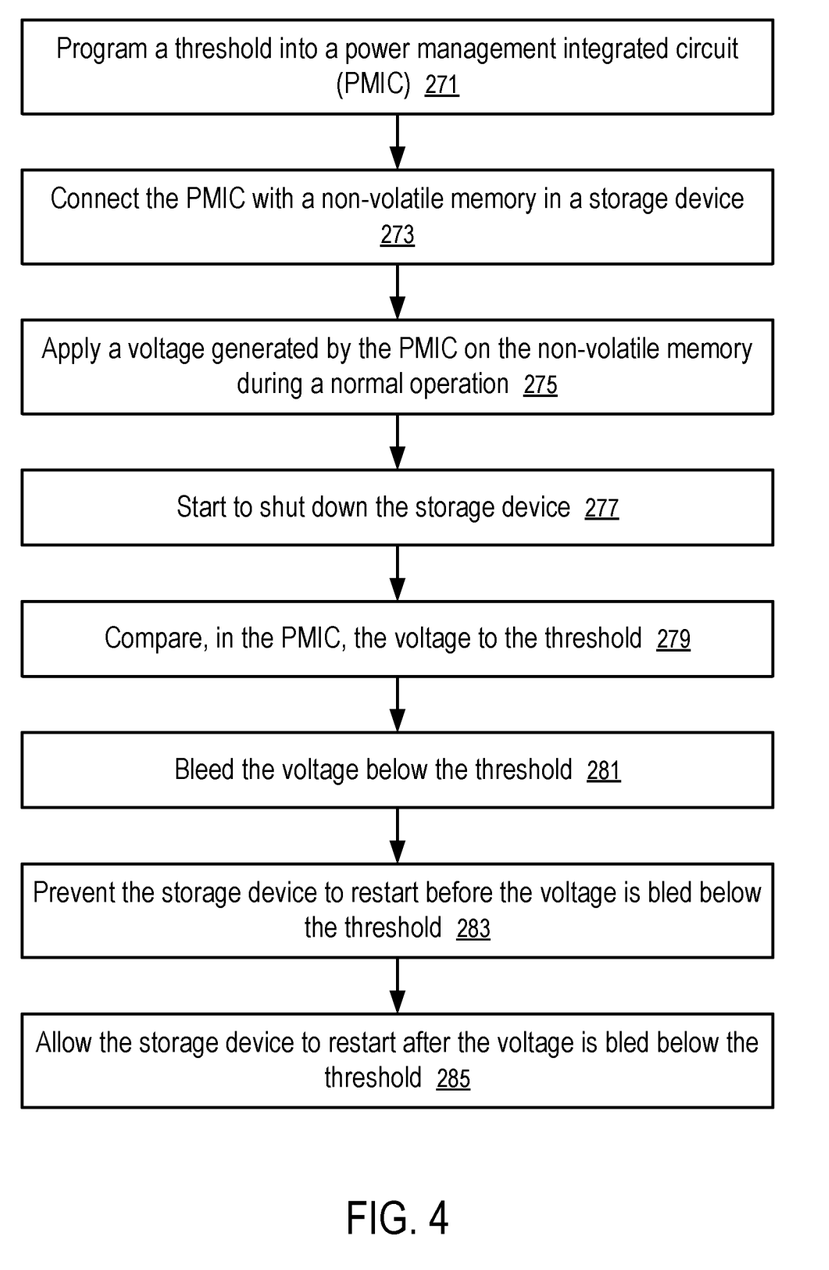
FIG. 4 shows a method to operation a storage device having a voltage controlled using a power management integrated circuit (PMIC).

FIG. 4 shows a method to operation a storage device having a voltage controlled using a power management integrated circuit (PMIC). For example, the method of FIG. 4 can be implemented in the data storage device (119) with a PMIC (111) illustrated in FIG. 2 and/or FIG. 3.

The method of FIG. 4 includes: programming (271) a threshold (243) into a power management integrated circuit (PMIC) (111); connecting (273) the PMIC (111) with a non-volatile memory (123) in a storage device (119); applying (275) a voltage ($V_{core}$) generated by the PMIC (113) on the non-volatile memory (123) during a normal operation; starting (277) to shut down the storage device (119); comparing (279), in the PMIC (111), the voltage ($V_{core}$) to the threshold (243); bleeding (281) the voltage ($V_{core}$) below the threshold (243); preventing (283) the storage device (119) to restart before the voltage ($V_{core}$) is bled below the threshold (243); and allowing (285) the storage device (119) to restart after the voltage ($V_{core}$) is bled below the threshold (243).

For example, a power management integrated circuit (111) includes: a voltage regulator (113) to generate an output voltage ($V_{core}$); a bleed function (131) that is activated during a shutdown process to reduce the output voltage ($V_{core}$) and to prevent restarting of the output voltage ($V_{core}$); and a sequencer (117) to control one or more sequences of operations involving at least the voltage regulator (113).

For example, the bleed function (131) includes: a bleed circuit (245); and a comparator (241) to generate an output based on comparing the output voltage ($V_{core}$) and a threshold (243). The output of the comparator (241) controls the engagement or activation status of the bleed circuit during the shutdown process. Preferably, the threshold (243) is programmable and/or adjustable after the production and/or packaging of the PMIC (111).

When the output voltage ($V_{core}$) is higher than the threshold (243) during the shutdown process, the output of the comparator (241) causes the bleed circuit (245) to engage in reducing the output voltage ($V_{core}$).

When the output voltage ($V_{core}$) is higher than the threshold (243) during the shutdown process, the output of the comparator (241) prevents the restart sequence of the sequencer (117), the voltage regulator (113), the output voltage ($V_{core}$), and/or other resources in the PMIC (111).

As an example, the bleed circuit (245) may include a resistor connected to a switch controlled by the output of the comparator (241) for selective engagement or activation in bleeding.

When the output voltage ($V_{core}$) is found no longer higher than the threshold (243) during the shutdown process, the output of the comparator (241) allows the restart of the voltage regulator (113), the sequencer (117), the output voltage ($V_{core}$), and/or other resources in the PMIC (111).

When the output voltage ($V_{core}$) is found no longer higher than the threshold (243) during the shutdown process, the output of the comparator (241) may deactivate or disengage the bleed circuit (245). In some instances, the deactivation or disengagement is further in response to an indication of restart of the voltage regulator (113), the sequencer (117), the output voltage ($V_{core}$), and/or other resources in the PMIC (111).

For example, the PMIC (111) discussed above can be configured in a storage device (119) having a non-volatile memory (123) that is powered by the output voltage ($V_{core}$) generated by the voltage regulator (113).

In one aspect, a method implemented in a power management integrated circuit (PMIC) (111) includes: generating, using a voltage regulator (113) of the PMIC (111), an output voltage ($V_{core}$). During a shutdown process, the method further includes activating a bleed function (131) of the PMIC (111), and reducing/bleeding the output voltage ($V_{core}$) using the bleed function (245).

When the bleed function (131) is activated, the method may further include: comparing the output voltage ($V_{core}$) to a threshold (243) using a comparator (241); generating an output by the comparator (241); and selectively allowing or preventing restart of the output voltage ($V_{core}$) in accordance with the output of the comparator (241).

Preferably, the threshold (243) is received from outside of the PMIC (111) during the calibration or adjustment of the PMIC (111) and/or the storage device (119). The threshold (243) is stored within the PMIC (111) for the comparator (241).

In response the output of the comparator (241) indicating that the output voltage ($V_{core}$) is lower than the threshold (243) (and, in some instances, in response to the PMIC (111), the sequencer (117), or the voltage regulator (113) being ready to restart), the method may further include deactivating the bleed function (131). The bleed function remains activated while the output voltage ($V_{core}$) is higher than the threshold (243) once the shutdown process starts and/or during the shutdown process.

In another aspect, a method includes: programming into a power management integrated circuit (PMIC) (111) a threshold (243) according to a voltage requirement of a non-volatile memory (123); and connecting the PMIC (111) and the non-volatile memory (123) in a storage device (119). During a normal operation of the storage device (119), the PMIC (111) generates and supplies a voltage ($V_{core}$) to the non-volatile memory (123). During a shutdown process of the storage device (119), a bleed function (131) of the PMIC (111) reduces or bleeds the voltage ($V_{core}$) below the threshold (243) before allowing restart of the storage device (119).

Optionally, the threshold (243) is programmed into the power management integrated circuit (PMIC) (111) after the PMIC (111) and the non-volatile memory (123) are assembled in the storage device (119) (e.g., during the testing, calibration, or fine tuning of the storage device (119)).

Alternatively, the threshold (243) is programmed into the power management integrated circuit (PMIC) (111) before the PMIC (111) is connected to the non-volatile memory (123) in the storage device (119) (e.g., during the testing, calibration, or fine tuning of the PMIC (111), in preparation for the installation of the PMIC (111) in the storage device (119) that is designed to use a particular type of non-volatile memories (e.g., 123)).

A non-transitory computer storage medium can be used to store instructions of the firmware of the storage device (119). When the instructions are executed by the controller (125) of the computer storage device (119), the instructions cause the controller (125) to perform a method discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A power management integrated circuit, comprising:
   a voltage regulator to generate an output voltage; and
   bleed circuit, coupled to the voltage regulator, that is activated during a shutdown process to reduce the output voltage and prevent restarting of the output voltage, wherein the bleed circuit comprises a comparator to generate an output from comparing the output voltage and a programmable threshold;
   wherein the output controls engagement of the bleed circuit during the shutdown process;
   wherein when the output voltage is higher than the threshold during the shutdown process, the output of the comparator causes the bleed circuit to engage in reducing the output voltage, and the comparator prevents the voltage regulator from restarting and powering up the output voltage;

wherein when the output voltage is higher than the threshold during the shutdown process, the output of the comparator prevents the sequencer from restarting from the shutdown process;

wherein the threshold is programmed into the power management integrated circuit before the power management integrated circuit is connected to the non-volatile memory in the memory system.

2. The power management integrated circuit of claim 1, wherein the bleed circuit comprises a resistor coupled to a switch controlled by the output.

3. The power management integrated circuit of claim 1, wherein when the output voltage is no longer higher than the threshold during the shutdown process, the output of the comparator allows the voltage regulator to restart.

4. The power management integrated circuit of claim 3, wherein when the output voltage is no longer higher than the threshold during the shutdown process, the output of the comparator allows a sequencer to restart, wherein the sequencer controls a sequence of operations involving at least the voltage regulator.

5. The power management integrated circuit of claim 4, wherein when the output voltage is no longer higher than the threshold during the shutdown process, the output of the comparator causes the bleed circuit to disengage from reducing the output voltage.

6. The power management integrated circuit of claim 4, wherein when the output voltage is no longer higher than the threshold during the shutdown process, the output of the comparator causes the bleed circuit to disengage from reducing the output voltage during restart after the shutdown process.

7. A memory system having a power management integrated circuit of claim 1, further comprising:

a non-volatile memory powered by the output voltage.

8. A method implemented in a power management integrated circuit, the method comprising:

generating, using a voltage regulator of the power management integrated circuit, an output voltage; and during a shutdown process:
activating a bleed function of the power management integrated circuit; and
reducing the output voltage using the bleed function, wherein when the bleed function is activated:
comparing the output voltage to a threshold;
generating an output from the comparing; and
allowing or preventing restart of the output voltage based on the output generated from the comparing;

deactivating the bleed function in response to the output voltage being lower than the threshold; and receiving from outside of the power management integrated circuit, and storing the threshold for the comparing;

wherein the threshold is programmed into the power management integrated circuit before the power management integrated circuit is connected to the non-volatile memory in the memory system.

9. The method of claim 8, wherein the bleed function remains activated while the output voltage is higher than the threshold during the shutdown process.

10. A method, comprising:

programming into a power management integrated circuit a threshold according to a voltage requirement of a non-volatile memory; and coupling the power management integrated circuit and the non-volatile memory in a memory system;

wherein:
during a normal operation of the memory system, the power management integrated circuit generates and supplies a voltage to the non-volatile memory; and
during a shutdown process of the memory system, a bleed function of the power management integrated circuit reduces the voltage below the threshold before allowing restart of the memory system;

wherein the threshold is programmed into the power management integrated circuit after the power management integrated circuit and the non-volatile memory are assembled in the memory system.

* * * * *